United States Patent

[11] 3,628,039

[72] Inventors Eugene V. Ochs
Mission Viejo;
Jeffrey L. Monroy, Santa Ana, both of Calif.
[21] Appl. No. 888,605
[22] Filed Dec. 29, 1969
[45] Patented Dec. 14, 1971
[73] Assignee Dana Laboratories, Inc.

[54] ELECTROMAGNETIC RADIATION WAVE SIGNAL TRANSMISSION APPARATUS
10 Claims, 4 Drawing Figs.

[52] U.S. Cl. .......... 250/239, 317/101, 250/228
[51] Int. Cl. .......... H01l 15/00
[50] Field of Search .......... 250/239, 228, 219 Q, 217, 208, 209; 307/117; 317/101 B, 101 C

[56] References Cited

UNITED STATES PATENTS

| | | | |
|---|---|---|---|
| 2,944,156 | 7/1960 | Davy et al. | 250/219 |
| 3,153,149 | 10/1964 | Finigian | 250/239 |
| 3,370,174 | 2/1968 | Toussaint | 250/217 X |
| 3,401,269 | 9/1968 | Tabet | 250/239 |
| 3,447,462 | 6/1969 | Mies | 250/228 X |

OTHER REFERENCES

Green et al.: IBM Technical Disclosure Bulletin, Vol. 4, No. 10, 3/62, page 1 250/239

*Primary Examiner*—Walter Stolwein
*Attorney*—Nilsson, Robbins, Wills & Berliner

ABSTRACT: One or more pairs of devices are aligned in a predetermined relationship upon a mounting member such as a printed circuit board. One of the devices is a light-emitting device, and the other is a light-responsive device. Each of the pairs of devices are covered by a surface which, at least over that area upon which the electromagnetic radiation from the emitting device impinges, is a segment of an ellipsoid. Preferably the cover is a figure of revolution of an ellipse about the major axis which is then divided in half by a plane extending through the major axis. When a plurality of pairs of such devices are utilized, the cover constitutes a plurality of half-ellipsoids interconnected together and arranged in such a manner that they include indexing means which mate with registration means on the printed circuit board so as to obtain proper alignment of the cover with each pair of devices. In any event, the alignment is such that each of the devices is positioned approximately at one focus of the half-ellipsoid, or segment thereof.

INVENTOR.
EUGENE V. OCHS
JEFFREY L. MONROY
BY
Nilsson & Robbins
Attorneys.

ELECTROMAGNETIC RADIATION WAVE SIGNAL TRANSMISSION APPARATUS

BACKGROUND OF THE INVENTION

In those areas of technology where it has become customary to transfer large amounts of signal-bearing information rapidly it has been discovered that stray capacitance existing between electrical components and their interconnections often creates undesirable difficulties leading to transfer of noise and thus ultimate misinformation.

One means of overcoming this problem has been to utilize the electrical energy-bearing signal information to generate waves of electromagnetic radiation, commonly falling within the light spectrum, both visible and nonvisible. Such radiation also bears the signal information contained within the electrical energy. This signal information-bearing radiation is then directed so as to impinge upon a radiation-responsive device spaced from the emitting device. In this manner, substantial electrical isolation is obtainable. However, certain difficulties have been encountered in utilizing devices in the manner above described.

As one example of the difficulties encountered, the beam of electromagnetic radiation generated, for example, by a photodiode is quite narrow, being approximately 20°. As a result, great care must be exercised in providing the proper alignment between the axis of radiation emission from the photodiode and the axis of the light-responsive device being utilized therewith, for example, a photo-transistor. If there is much deviation between the axes of the two devices, the emission from the photodiode will either completely miss the phototransistor or such a small amount of the radiation will impinge upon the phototransistor that the circuit will be substantially nonoperative for the purposes intended. Since such great care is required, these devices re normally aligned by the manufacturer and then permanently encased in a housing which thereafter maintains the alignment. If either of the devices subsequently develops a malfunction, the entire package must generally be discarded and a new one substituted in its place. As a result, both the original and replacement costs for such devices is extremely high.

SUMMARY OF THE INVENTION

Transmission apparatus for conveying signal information in electromagnetic radiation waveform which includes radiation emitter and receiver means positioned with respect to a reflecting ellipsoid segment in such a manner that the emitter is positioned approximately at one focus thereof and the receiver is positioned at approximately the other focus thereof.

DETAILED DESCRIPTION OF THE INVENTION

Figures 1, 2A, 2B, 3:
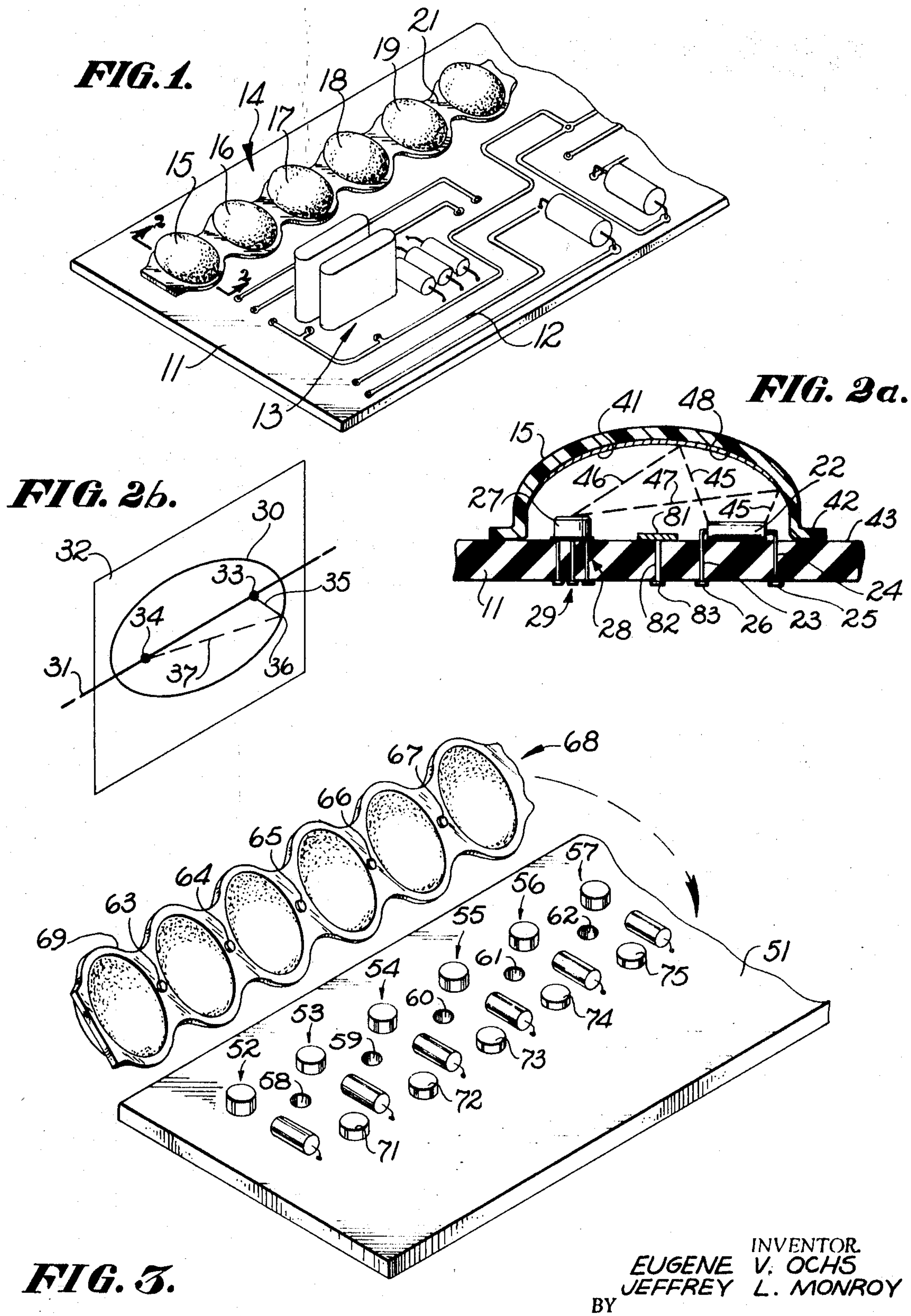
FIG. 1 is a schematic illustration of a completed circuit board containing apparatus constructed in accordance with the present invention.
FIG. 2*a* is a segmented cross-sectional view of a portion of FIG. 1 taken about the lines 2—2 thereof.
FIG. 2*b* is a geometric illustration showing generation of apparatus in accordance with the present invention.
FIG. 3 is an exploded view of a structure similar to that shown in FIG. 1 at an intermediate stage of completion.

Referring now to the drawings, there is illustrated a mounting means such, for example, as a printed circuit board 11 having various conductive patterns 12 thereon in addition to components 13, both the pattern and the components being old and well known in that art and requiring no discussion herein.

In accordance with the present invention, there is also mounted upon the printed circuit board a strip of material 14 including a plurality of dome-shaped members 15 through 19 interconnected by a continuous web 21. Positioned beneath each of the domes 15 through 19 is an emitter of electromagnetic radiation waves and a receiver which is responsive to such waves. The emitter and receiver are more fully illustrated in FIG. 2*a* to which reference is hereby made.

FIG. 2*a* shows the printed circuit board 11 having an electromagnetic radiation device such as a photodiode 22 positioned thereon with the leads 23 and 24 extending through the board and into contact with metallic interconnecting strips 25 and 26 as is well known. Also positioned beneath the dome 15 is an electromagnetic radiation responsive device such as a phototransistor 27 also having a plurality of leads 28 also interconnected to metallic strips 29.

As is illustrated in FIG. 2*a*, the dome 15 is a segment of an ellipsoid and as is illustrated, is substantially a half-ellipsoid. As is well known, an ellipsoid is a surface, all plain sections of which are ellipses or circles. By way of further illustration and clarification there is shown in FIG. 2*b* an ellipse 30 having a major axis 31. If the ellipse 30 is revolved about the major axis 31, an ellipsoid is generated by such a figure of revolution. If the ellipsoid so generated is then divided in half by a plane 32 which passes through the major 31 of the ellipse 30, then the half-ellipsoid above referred to is obtained.

As is well known, any ellipse has two foci 33 and 34. As is also further known, if radiation, for example, light is emitted from one focus, such as 33, and follows a path as shown at 35 and is reflected at the point 36 it will impinge upon the other focus 34 as shown by the dashed line 37. Another way of stating the same thing is that the sum of the length of any two lines drawn between the foci 33 and 34 of the ellipse 30 and intersecting at a common point on the ellipse will always be equal.

These principals are applied to construct apparatus in accordance with the present invention. As is illustrated in FIG. 2*a*, each of the dome-shaped members 15 through 19 is constructed in such a manner that there is provided an inner surface 41 in the form of a half-ellipsoid and which is reflective at the frequency of the electrogmanetic radiation emitted by the emitter means, such as the photodiode 22. The photodiode 22 is positioned at one focus of the ellipsoid segment 41 and the phototransistor 27 is positioned at the other focus thereof. It has been discovered that the positioning of the emitter and receiver devices is not critical and may vary by as much as approximately one-eighth inch when utilizing an ellipsoid having a major axis of approximately three-fourths inch in length. As is illustrated, the web 21 forms an outwardly extending flange 42 which is utilized to secure the dome-shaped member 15 to the upper surface 43 of the printed circuit board 11. This securing may be accomplished by adhesives or by screwing or bolting the structure to the surface of the board 11 in any manner desired.

When the dome-shaped member 15 and the emitter 22 and receiver 27 are properly positioned relative to each other, as above described, the electromagnetic radiation being emitted by the diode 22 may, for example, fall within the angular area shown by the lines 44 and 45 in such a manner that the surface 41 intercepts the same. Since the surface 41 is reflective, the radiation then is reflected therefrom and follows the path shown by the lines 46 and 47 so as to impinge upon the phototransistor 27. Thus, it should become clear to those skilled in the art that the signal information contained by the emitted radiation from diode 22 is transmitted by reflection from the ellipsoid segment 41 to the phototransistor 27. It should also become clear that the ellipsoid segment 41 need not be a half-ellipsoid but the dome-shaped member 15 may have any geometric shape desired, or combinations of shapes, so long as that portion of the surface 41, for example, as shown at 48 which is illuminated by the radiation from the photodiode 22 is a segment of an ellipsoid, and the diode 22 and transistor 27 are properly positioned at the two foci of the ellipse the revolution of which would form the segment 48.

To obtain the desired positioning of the strip of dome-shaped members 15 through 19 which forms the cover means for the emitter and receiver devices as above described, various indexing and registering means may be utilized as illustrated in FIG. 3 to which reference is hereby made. As is therein shown, the printed circuit board 51 has a plurality of pairs 52 through 57 of emitters and receivers as above described. Disposed between each pair is a registration means such as a depression or opening 58 through 62. Disposed upon the strip 68 forming the cover means are a plurality of indexing means such as downwardly protruding members 63 through 67 each of which is adapted to matably register with the depressions or openings 58 through 62 respectively. Thus, after affixing the pairs of emitters and receivers 52 through 57 upon the surface of the board 51 so that they are properly aligned with each other and also along the required foci, the cover means 68 may be indexed and registered in place with respect thereto so as to obtain the proper transfer of signal information in the manner above stated. Additional indexing and registration may be provided, or it may be alternately used, by causing the convolutions shown at 69 along the edge of the strip 68 to conform to the shape of components such as driver transistors illustrated generally at 71 through 75 upon the printed circuit board 51. Thus, the convolution 69 may be brought into engagement with the edges of the drive transistors 71 through 75 to thereby register the ellipsoid segments properly with respect to the pairs of emitters and receivers as referred to above.

The cover means may be formed of any material desired and as one example, illustrated in FIG. 2, may be molded or formed of plastic material such as a styrene or vinyl which has the inner surface thereof metallized as by vacuum deposition, plating, or painting, depending upon the frequency of the electromagnetic radiation being emitted. If shielding becomes a critical factor, then the cover means may be constructed of a metallic material instead of plastic. Furthermore, either with utilization of the plastic material as illustrated, or with the metallic material, a guard member may be utilized, such for example as a strip of metal 81 which may be laid down between the emitter 22 and the receiver 27 and then through utilization of a lead 82 may be interconnected through appropriate circuit connections 83 to a reference point such as ground. When such is done, the electrical isolation between the two devices is substantially improved. Even without the utilization of the guard 81, the coupling between the emitter 22 and the receiver 27 when utilizing a half-ellipsoid of three-fourths inch in length along its major diameter has been reduced to approximately 0.1 picofarads.

Through utilization of a structure similar to that illustrated in FIG. 2*a*, the costs of manufacturing a signal transmitting pair has been reduced by a factor of approximately 6while maintaining an efficiency of information transmission equal to prior art devices and, at the same time, reducing the capacity coupling therebetween.

What is claimed is:

1. Transmission apparatus for conveying signal information in electromagnetic radiation waveform while maintaining physical and substantial electrical isolation comprising:
   a. a printed circuit board having a printed circuit thereon defining a first plane surface;
   b. electromagnetic radiation wave emitter means electrically interconnected with said printed circuit affixed at a first location on said surface and in a plane parallel to said surface for emitting radiation in a predetermined direction;
   c. electromagnetic radiation wave receiver means electrically interconnected with said printed circuit affixed at a second location on said surface and in a plane parallel to said surface; and
   d. cover means affixed to said surface positioned over said emitter and receiver means, and defining a curved surface positioned to intercept substantially all of said emitted radiation, at least said curved surface being a reflective segment of an ellipsoid,
      1. said first location being at approximately one focus of said ellipsoid segment, and
      2. said second location being at approximately the other focus of said ellipsoid segment, whereby said emitted radiation is focused onto said receiver means.

2. Transmission apparatus as defined in claim 1 wherein said cover means is a figure of revolution of an ellipse taken about the major axis thereof and then divided approximately in half by a plane extending parallel to said major axis, and the inner surface thereof is reflective to said waves.

3. Transmission apparatus as defined in claim 2 wherein said cover means further includes an outwardly extending peripheral flange, said flange being affixed to said mounting member.

4. Transmission apparatus as defined in claim 1 wherein said cover means further includes indexing means and said circuit board includes register means mateable with said indexing means thereby to position said cover member in proper relation to said emitter and receiver means.

5. Transmission apparatus as defined in claim 1 wherein said emitter means is a plurality of light-emitting devices spaced apart on said board, and said receiver means is a plurality of light-responsive devices spaced apart on said board and aligned each with a separate light-emitting device.

6. Transmission apparatus as defined in claim 5 wherein said cover means is a plurality of hollow shell-like members interconnected in a predetermined manner to each cover one aligned transmitting device and receiving device.

7. Transmission apparatus as defined in claim 6 wherein each of said shell-like members is a figure of revolution of an ellipse taken about the major axis thereof and then divided approximately in half by a plane extending parallel to said major axis.

8. Transmission apparatus as defined in claim 1 wherein a metallic member connected to a point of reference potential is positioned between said emitter and receiver means thereby to effect greater electrical isolation therebetween.

9. Transmission apparatus as defined in claim 4 wherein said indexing means is a plurality of protrusions and said register means is a plurality of depressions.

10. Transmission apparatus as defined in claim 6 wherein said cover means is a continuous molded plastic member having the inner surface thereof metallized.

* * * * *